United States Patent
Saito et al.

(10) Patent No.: US 9,893,265 B2
(45) Date of Patent: Feb. 13, 2018

(54) CRYSTAL RESONATION DEVICE AND PRODUCTION METHOD THEREFOR

(71) Applicant: MURATA MANUFACTURING CO., LTD., Nagaokakyo-shi, Kyoto-Fu (JP)

(72) Inventors: Yoshifumi Saito, Nagaokakyo (JP); Toshiyuki Yasugi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 882 days.

(21) Appl. No.: 14/332,561

(22) Filed: Jul. 16, 2014

(65) Prior Publication Data
US 2014/0327341 A1    Nov. 6, 2014

Related U.S. Application Data

(63) Continuation of application No. PCT/JP2013/060614, filed on Apr. 8, 2013.

(30) Foreign Application Priority Data

Apr. 23, 2012 (JP) ................ 2012-097946

(51) Int. Cl.
| | |
|---|---|
| H01L 41/053 | (2006.01) |
| H03H 9/10 | (2006.01) |
| B81C 1/00 | (2006.01) |
| H01L 41/23 | (2013.01) |
| H01L 23/053 | (2006.01) |

(52) U.S. Cl.
CPC ........ *H01L 41/053* (2013.01); *B81C 1/00269* (2013.01); *H01L 41/23* (2013.01); *H03H 9/1021* (2013.01); *B81B 2201/0271* (2013.01); *B81C 2203/0109* (2013.01); *B81C 2203/019* (2013.01); *H01L 23/053* (2013.01); *H01L 2924/0002* (2013.01); *Y10T 156/10* (2015.01)

(58) Field of Classification Search
CPC ... H01L 41/053; H01L 41/23; B81C 1/00269; H03H 9/1021
USPC ......................... 310/340, 344, 348
See application file for complete search history.

(56) References Cited

U.S. PATENT DOCUMENTS

| | | | |
|---|---|---|---|
| 6,541,897 B2 * | 4/2003 | Endoh | H03H 9/1021 310/340 |
| 8,330,336 B2 | 12/2012 | Kameda et al. | |

(Continued)

FOREIGN PATENT DOCUMENTS

| | | |
|---|---|---|
| JP | 02-125640 | 5/1990 |
| JP | 2002-026679 A | 1/2002 |

(Continued)

OTHER PUBLICATIONS

PCT/JP2013/060614 Written Opinion dated Jun. 18, 2013.
PCT/JP2013/060614 ISR dated Jul. 2, 2013.

*Primary Examiner* — Thomas Dougherty
(74) *Attorney, Agent, or Firm* — Arent Fox LLP

(57) ABSTRACT

A crystal resonation device that includes a base plate, a cap, a joining material, and a crystal resonator. The cap is provided on the base plate. The cap forms a sealed space with the base plate. The joining material joins the base plate and the cap. The joining material contains a cured material of thermosetting resin. The crystal resonator is provided on the base plate in the sealed space. The joining material is located in an outer side portion of a wall of the cap joined to the joining material.

10 Claims, 1 Drawing Sheet

(56) References Cited

U.S. PATENT DOCUMENTS

| | | | |
|---|---|---|---|
| 2001/0022488 A1* | 9/2001 | Kawauchi | H03H 9/1021 |
| | | | 310/348 |
| 2002/0113523 A1* | 8/2002 | Endoh | H03H 9/1021 |
| | | | 310/344 |
| 2010/0132185 A1* | 6/2010 | Horiguchi | B81C 1/00269 |
| | | | 29/592.1 |
| 2013/0300260 A1* | 11/2013 | Liu | H03H 9/1021 |
| | | | 310/344 |
| 2015/0022059 A1* | 1/2015 | Saito | H03H 9/1021 |
| | | | 310/344 |

FOREIGN PATENT DOCUMENTS

| | | |
|---|---|---|
| JP | 2002-064159 A | 2/2002 |
| JP | 2005-167129 A | 6/2005 |
| JP | 2008-177610 A | 7/2008 |
| JP | 2010-192627 A | 9/2010 |
| WO | WO-2009-072351 A1 | 6/2009 |

\* cited by examiner

CRYSTAL RESONATION DEVICE AND PRODUCTION METHOD THEREFOR

CROSS REFERENCE TO RELATED APPLICATIONS

The present application is a continuation of International application No. PCT/JP2013/060614, filed Apr. 8, 2013, which claims priority to Japanese Patent Application No. 2012-097946, filed Apr. 23, 2012, the entire contents of each of which are incorporated herein by reference.

FIELD OF THE INVENTION

The present invention relates to a crystal resonation device and a production method therefor.

BACKGROUND OF THE INVENTION

A crystal resonation device using a crystal resonator is known. In a general type of crystal resonation device, a crystal resonator is provided in a sealed space. This reduces the influence of disturbance on the crystal resonator.

A sealed space is formed, for example, by joining a base plate and a cap with a joining material such as thermosetting resin (see, for example, Patent Document 1).

Patent Document 1: International Publication No. WO2009/072351

SUMMARY OF THE INVENTION

However, when the joining material for joining the base plate and the cap is formed using thermosetting resin, after the thermosetting resin is cured, gasified components contained in the joining material are sometimes released from the joining material into the sealed space. If such gasified components adhere to a surface of the crystal resonator, resonance characteristics of the crystal resonator sometimes degrade.

A main object of the present invention is to provide a crystal resonation device that is unlikely to cause degradation of resonance characteristics of a crystal resonator.

A crystal resonation device according to the present invention includes a base plate, a cap, a joining material, and a crystal resonator. The cap is provided on the base plate. The cap forms a sealed space with the base plate. The cap is dome-shaped. The joining material joins the base plate and the cap. The joining material contains a cured material of thermosetting resin. The crystal resonator is provided on the base plate in the sealed space. The joining material is located in an outer side portion of an inner wall of a part of the cap joined to the joining material.

According to a specific aspect of the crystal resonation device of the present invention, a portion of the joining material closer to the inner wall than a center in a width direction of the part of the cap joined to the joining material is smaller than a portion closer to an outer wall of the part of the cap joined to the joining material.

A production method for a crystal resonation device according to the present invention is a production method for the above-described crystal resonation device. The production method for the crystal resonation device according to the present invention includes a joining step of joining one principal surface of the base plate on which the crystal resonator is provided to the cap with thermosetting resin to form the joining material. The joining step is performed so that the joining material is located in the outer side portion of the inner wall of the part of the cap joined to the joining material.

According to a specific aspect of the production method for the crystal resonation device of the present invention, in the joining step, after the thermosetting resin is gelled, the thermosetting resin is heated so that an internal pressure of the sealed space increases, the thermosetting resin moves outward, and the joining material is located in the outer side portion of the inner wall of the part of the cap joined to the joining material.

According to the present invention, it is possible to provide a crystal resonation device that is unlikely to cause degradation of resonance characteristics of a crystal resonator.

DETAILED DESCRIPTION OF THE PREFERRED EMBODIMENTS

Figure 1:
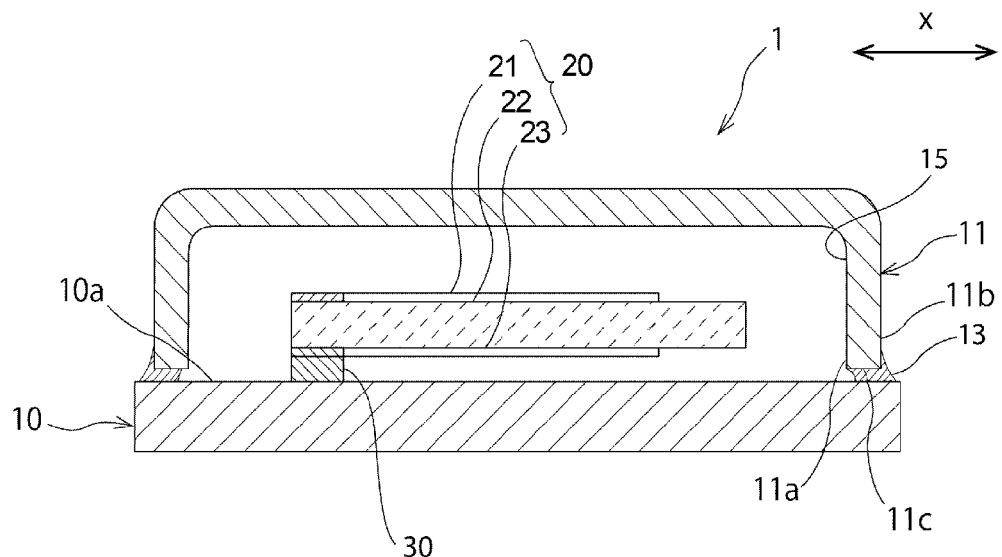
FIG. 1 is a schematic cross-sectional view of a crystal resonation device according to an embodiment of the present invention.

A preferred embodiment of the present invention will be described below. However, the following embodiment is just exemplary. The present invention is not limited to the following embodiment.

In the drawings which are referred to in the embodiment, members having substantially identical functions are denoted by the same reference numerals. Further, the drawings which are referred to in the embodiment are schematic and the proportion in dimensions of each object drawn in the drawings is sometimes different from that of the actual object. The proportion in dimensions of the object is sometimes different between the drawings. Specific proportion of dimensions of the object should be determined in view of the following description.

FIG. 1 is a schematic cross-sectional view of a crystal resonation device according to this embodiment. A crystal resonation device 1 according to the embodiment will be described with reference to FIG. 1.

As illustrated in FIG. 1, the crystal resonation device 1 includes a base plate 10, a cap 11, a joining material 13, and a crystal resonator 20.

The base plate 10 is shaped like a flat plate. The material of the base plate 10 is not particularly limited. For example, the base plate 10 can be formed of metal such as iron or aluminum, an alloy such as stainless steel, or a ceramic material such as alumina.

The cap 11 is provided on the base plate 10. The cap 11 forms a sealed space 15 with the base plate 10. The cap 11 is dome-shaped. The cap 11 is provided such that a recess thereof is open to the base plate 10. The cap 11 can be formed of a material similar to that of the base plate 10.

Within the sealed space 15, the crystal resonator 20 is provided on the base plate 10. Specifically, the crystal resonator 20 is provided on a support member 30 that is provided on the base plate 10. For example, the support member 30 can be formed of an insulating material such as a ceramic material, or a conductive material such as a metal material. The support member 30 can be set on the base plate 10, for example, with conductive adhesive or solder.

Specifically, the crystal resonator 20 includes a crystal blank 22 and a pair of electrodes 21 and 23. The electrode 21 is provided on one principal surface of the crystal blank 22, and the electrode 23 is provided on the other principal surface of the crystal blank 22. Voltage is applied from these electrodes 21 and 23 to the crystal blank 22. For example, the electrodes 21 and 23 can be formed of metal such as aluminum, silver, copper, or gold, or an alloy containing at least one of these metals.

The joining material 13 is provided on the base plate 10. The joining material 13 joins the base plate 10 and the cap 11. The joining material 13 surrounds the crystal resonator 20. The joining material 13 contains a cured material of thermosetting resin. The joining material 13 may be formed of a cured material of thermosetting resin or may be formed of a cured material of a thermosetting resin composition containing a filler, for example. Epoxy resin is given as an example of thermosetting resin.

The joining material 13 is located in an outer side portion of an inner wall 11a of a part of the cap 11 joined to the joining material 13. For this reason, the surface area of a portion of the joining material 13 exposed in the sealed space 15 is less than the surface area of a portion of the joining material 13 exposed to the outside of the sealed space 15. Hence, gasified components contained in the joining material 13 are released more to the outside of the sealed space 15 than into the sealed space 15. Therefore, the gasified components contained in the joining material 13 are unlikely to adhere to a surface of the crystal resonator 20, and this can suppress degradation of resonance characteristics of the crystal resonator 20. Preferably, a portion of the joining material 13 closer to the inner wall 11a than a center 11c in a width direction (x-direction) of the part of the cap 11 joined to the joining material 13 is smaller than a portion closer to an outer wall 11b of the part of the cap 11 joined to the joining material 13. In this case, the gasified components contained in the joining material 13 are likely to be released to the outside of the sealed space 15. Therefore, degradation of resonance characteristics of the crystal resonator 20 can be suppressed more effectively.

Figure 2:
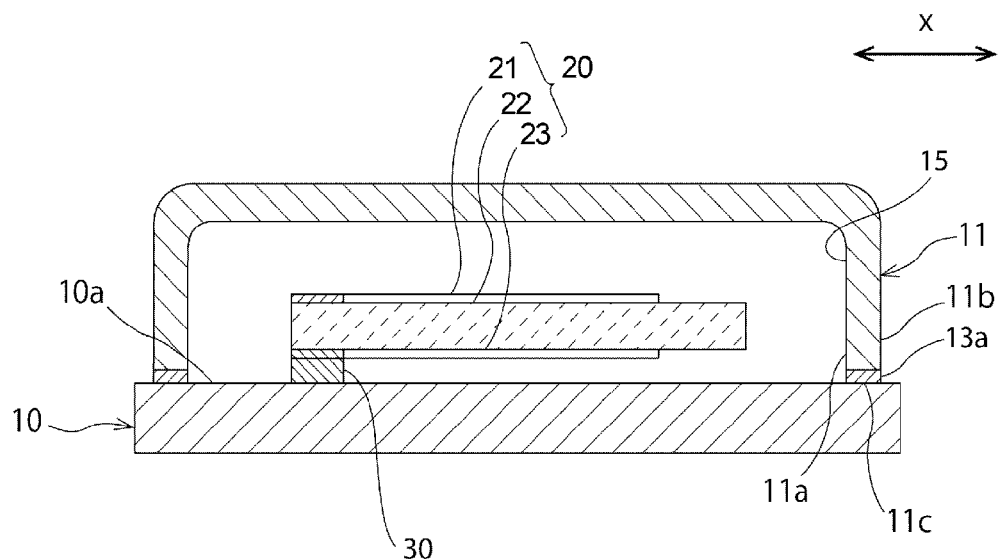
FIG. 2 is a schematic cross-sectional view for illustrating a production method for the crystal resonation device according to the embodiment of the present invention.

Next, an example of a production method for the crystal resonation device 1 will be described. As illustrated in FIG. 2, a joining step is performed to join a principal surface 10a of a base plate 10, on which a crystal resonator 20 is provided, to a cap 11 with a joining material 13 formed of thermosetting resin 13a to form a sealed space 15. The joining step is performed so that the joining material 13 is located in an outer side portion of an inner wall 11a of a part of the cap 11 joined to the joining material 13. More specifically, in the joining step, after the thermosetting resin 13a is gelled, it is heated so that the internal pressure of the sealed space 15 increases and the thermosetting resin 13a moves to the outer side portion of the inner wall 11a of the part of the cap 11 joined to the joining material 13. In the gelled thermosetting resin 13a, air permeability decreases, but the thermosetting resin 13a is not completely cured. For this reason, when the internal pressure of the sealed space 15 is increased by heating the gelled thermosetting resin 13a, the thermosetting resin 13a moves to the outer side portion of the inner wall 11a of the cap 11. After that, when the gelled thermosetting resin 13a is cured by heating, the joining material 13 can be formed. For this reason, in the crystal resonation device 1, the joining material 13 can be located in the outer side portion of the inner wall 11a of the part of the cap 11 joined to the joining material 13. The joining step can be performed in a vacuum.

REFERENCE SIGNS LIST 1 crystal resonation device
10 base plate
10a principal surface
11 cap
11a inner wall
11b outer wall
11c center
13 joining material
13a thermosetting resin
15 sealed space
20 crystal resonator
21, 23 electrode
22 crystal blank
30 support member

The invention claimed is:

1. A crystal resonation device comprising:
a base plate;
a cap on the base plate, the cap forming a sealed space with the base plate;
a joining material joining the base plate and the cap, the joining material containing a cured material of thermosetting resin; and
a crystal resonator provided on the base plate in the sealed space,
wherein, relative to the sealed space, the joining material is located in an outer side portion of a wall of the cap joined to the joining material.

2. The crystal resonation device according to claim 1, wherein a first portion of the joining material closer to an inner side portion of the wall than a center of the wall in a width direction of the wall is smaller than a second portion of the joining material closer to the outer side portion of the wall of the cap.

3. The crystal resonation device according to claim 1, wherein the base plate is a flat plate.

4. The crystal resonation device according to claim 1, further comprising a support member supporting the crystal resonator on the base plate.

5. The crystal resonation device according to claim 1, wherein the joining material surrounds the crystal resonator.

6. The crystal resonation device according to claim 1, wherein the cured material of thermosetting resin is a composition containing a filler.

7. The crystal resonation device according to claim 1, wherein a first surface area of a first portion of the joining material exposed in the sealed space is less than a second surface area of a second portion of the joining material exposed to an outside of the sealed space.

8. A production method for the crystal resonation device that includes a base plate; a cap on the base plate, the cap forming a sealed space with the base plate; a joining material joining the base plate and the cap, the joining material containing a cured material of thermosetting resin; and a crystal resonator provided on the base plate in the sealed space, wherein, relative to the sealed space, the joining material is located in an outer side portion of a wall of the cap joined to the joining material, the production method comprising:
joining one principal surface of the base plate on which the crystal resonator is provided to the cap with a thermosetting resin to form the joining material; and heating the joining material so that the joining materials is located in the outer side portion of the wall of the cap.

9. The production method for the crystal resonation device according to claim 8, wherein the heating is conducted after the thermosetting resin is gelled.

10. The production method for the crystal resonation device according to claim 9, wherein the heating is conducted such that an internal pressure of the sealed space increases and forces the thermosetting resin to move outward away from the internal space.

* * * * *